United States Patent [19]

Nguyen

[11] Patent Number: 5,682,049
[45] Date of Patent: Oct. 28, 1997

[54] METHOD AND APPARATUS FOR TRIMMING AN ELECTRICAL VALUE OF A COMPONENT OF AN INTEGRATED CIRCUIT

[75] Inventor: Baoson Nguyen, Plano, Tex.

[73] Assignee: Texas Instruments Incorporated, Dallas, Tex.

[21] Appl. No.: 510,159

[22] Filed: Aug. 2, 1995

[51] Int. Cl.$^6$ .............. H01L 29/04; H01L 23/62; H01L 29/00
[52] U.S. Cl. .............. 257/363; 257/50; 257/530; 257/533; 257/360
[58] Field of Search .............. 257/529, 530, 257/50, 360, 543, 363, 533, 507

[56] References Cited

U.S. PATENT DOCUMENTS

| | | | |
|---|---|---|---|
| 4,786,956 | 11/1988 | Puar | 257/363 |
| 4,941,028 | 7/1990 | Chen et al. | 257/322 |
| 5,341,267 | 8/1994 | Whitten et al. | 361/56 |
| 5,498,895 | 3/1996 | Chen | 257/355 |

Primary Examiner—Stephen Meier
Assistant Examiner—Valencia Martin Wallace
Attorney, Agent, or Firm—W. Daniel Swayze, Jr.; W. James Brady, III; Richard L. Donaldson

[57] ABSTRACT

An integrated circuit and method for using same is constructed on a semiconductor substrate (15) with a structure (24) in the substrate (15) having an electrical value desired to be trimable and with a conducting layer (33) on the substrate (15) insulated (30) from the structure (14) except at one location (26), which is electrically connected to a first part of the structure (24). An oxide layer (48) separates one portion of the structure (24) from a part of the conductor (33). The second oxide layer (48) has a predetermined breakdown voltage such that when a voltage, $V_{TRIM}$, larger than the second predetermined breakdown voltage is applied between the conductor (33) and the structure (24), the second oxide layer (48) breaks down, shorting the first and second parts (46, 50) of the structure (24) to trim its value.

9 Claims, 2 Drawing Sheets

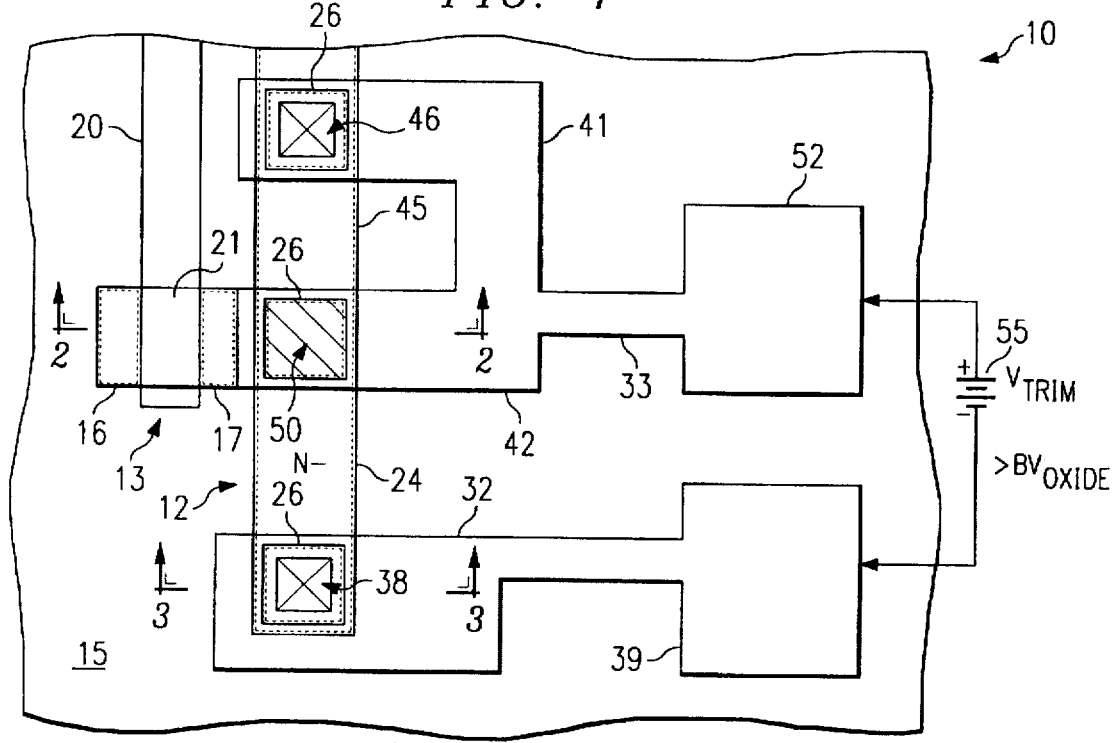
FIG. 1
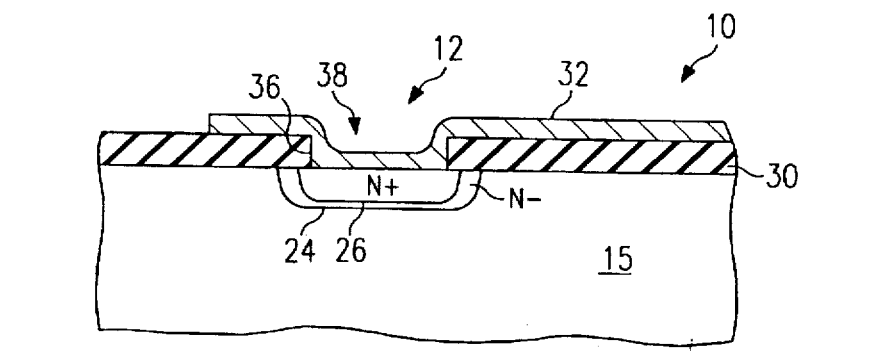
FIG. 2
FIG. 3

METHOD AND APPARATUS FOR TRIMMING AN ELECTRICAL VALUE OF A COMPONENT OF AN INTEGRATED CIRCUIT

BACKGROUND OF THE INVENTION

1. Field of the Invention

This invention relates to improvements in integrated it techniques and structures, and more particularly to improvements in techniques for trimming the electrical value of an integrated circuit structure, such as an integrated circuit resistor, or the like.

2. Relevant Background

It is often desirable to be able to trim or adjust the electrical value of certain integrated circuit structures after completion of construction of at least the majority of the integrated circuit. Although examples are manifold, one example is a bandgap circuit that is to produce a precise voltage output. Due to process variations that invariably appear during the manufacture of the integrated circuit which contains the circuit, the precise output of the bandgap circuit varies somewhat from the desired value.

One of the ways that this problem has been addressed in the past has been to trim a resistor that is associated with the circuit, such as by laser trimming techniques, or the like. Laser trimming, however, is generally heavily labor intensive, and often leaves debris that may affect the performance and reliability of the remainder of the circuitry. Laser trimming techniques also require relatively expensive laser, optical, and positioning equipment to perform the trimming procedures.

Another technique which has been used to enable post-construction adjustment of the electrical value of a component is to provide one or more "antifuse" devices, usually in the form of a zener diode, or the like, at strategic locations in the integrated circuit, for example, in parallel with the component, or a part thereof. A voltage of sufficient level may be selectively applied to "zap" the diode, causing it to short. The shorted diode effectively removes the component, or part of the component, across which it is Connected. Such antifuse devices, however, require relatively high currents to configure, and often require special temporary pin assigning logic to allow the voltages to be applied to the package pins in a preassigned combination for antifuse configuration. If a zener "zapping" process is performed prior to packaging, such as during multiprobe testing or other point in the fabrication process, the probe tips of the tester often become burned or damaged due to the high voltages applied. Also, such antifuses have an unusual characteristic of hardening when a non-effective voltage is applied. This hardening results in the antifuse becoming difficult or impossible to blow if the voltage intended to cause it to blow is actually insufficient. That is, once the attempt is made, if the fuse does not blow, the entire part probably will need to be discarded.

Another technique involves poly fuses, which have an short electrical characteristic until a predetermined voltage is applied, after which they have an open electrical characteristic. One of the well known problems exhibited by usual fuse structures is that they typically generate large amounts of debris and circuit contaminants when they are "blown". Also, such fuses have an undesirable characteristic of regrowth with time.

For all of the above techniques, special structures need to be provided to enable the respective technique to be carried out. Usually, extra process steps need to be added to the process flow for the particular integrated circuit being constructed. As known, extra steps in the process flow results in increased process complexity and decreased yield.

SUMMARY OF THE INVENTION

In light of the above, it is an object of the invention to provide an improved electronic breakdown, or antifuse-type, device, which is open in an original state or condition, and which can be broken down by application of a predetermined voltage to present a short in a modified state or condition.

It is another object of the invention to provide an improved electronic breakdown device of the type described that can be constructed using MOS technology or processes.

It is another object of the invention to provide an improved electronic breakdown device of the type described that can be actuated using much lower currents than required by typical zener zapping techniques.

It is another object of the invention to provide an improved electronic breakdown device of the type described, which does not produce large amounts of debris when it is exposed to the predetermined voltage to change its conductivity from open to shorted.

It is another object of the invention to provide an improved electronic breakdown device of the type described, which does not require current levels as high as those required to actuate poly fuses or zener zapping techniques, and does not involve complicated EEPROM processes.

It is another object of the invention to provide an improved electronic breakdown device of the type described that can be used to trim resistor or other integrated circuit elements to enable their values to be adjusted after manufacture.

It is another object of the invention to provide an improved method for trimming resistor or other integrated circuit elements to enable their values to be adjusted after manufacture.

It is another object of the invention to provide an improved method for trimming resistor or other integrated circuit elements to enable their values to be adjusted after manufacture, in which electronic breakdown device structures can be fabricated as a part of a standard CMOS integrated circuit fabrication process.

These and other objects features and advantages will become apparent to those skilled in the art from the following detailed description, when read in conjunction with the accompanying drawings and appended claims.

According to a broad aspect of the invention, a one-time alterable structure for providing an electrical open in a first state and an electrical short in a second state is presented. The alterable structure, such as an integrated circuit resistor, is constructed in a semiconductor substrate and has a conducting layer, such as metal, doped polysilicon, or other suitable conducting material, insulated from the structure on the substrate. The conducting layer is connected at one end to a first end of the structure and has an insulation layer on a second end of the structure and separating the conducting layer from the second end of the structure. The insulation layer may be formed of the same material as a gate dielectric of an accompanying MOS device, and may have a predetermined breakdown voltage, so that when a voltage larger than the predetermined breakdown voltage is applied between the conducting layer and the substrate, the insulation layer breaks down, shorting the conducting layer across the structure. For convenience in applying the breakdown voltage, a conductive pad may be located over and isolated from the substrate, the conductive pad being connected to the conducting layer.

According to another broad aspect of the invention, an integrated circuit having an electrically trimable structure is presented. The integrated circuit is constructed in a semiconductor substrate and has an MOS device having a first oxide layer between a control element and the substrate. The first oxide layer has a first breakdown voltage. A semiconductor structure, such as an integrated circuit resistor or the like, is located in the substrate, having an electrical value desired to be trimable. A conducting layer of metal, doped polysilicon, or other suitable conducting material on the substrate is insulated from the structure except at one location, the one location being electrically connected to a first part of the structure. A second oxide layer separates another location on the semiconductor structure and another part of the structure, the second oxide layer having a second predetermined breakdown voltage less than the first breakdown voltage. When a voltage larger than the second predetermined breakdown voltage is applied between the conducting layer and the substrate, the second oxide layer breaks down, shorting the first and second parts of the structure. To provide a location for application of the second predetermined breakdown voltage, a conductive pad connected to the conducting layer may be provided on and insulated from the substrate.

According to yet another broad aspect of the invention, an integrated circuit having an electrically trimable structure is presented. The structure may be, for example, an integrated circuit resistor or the like. An MOS transistor is connected in parallel with at least a portion of the structure. A conductor is electrically connected to a control element of the MOS transistor. An insulation layer which has a predetermined breakdown voltage separates the conductor of metal, doped polysilicon, or other suitable conducting material from the substrate. When a voltage larger than the predetermined breakdown voltage is applied between the conductor and the substrate, the insulation layer breaks down to short the conductor to the substrate to bias the MOS transistor into conduction. The MOS transistor has a gate dielectric between the control element and the substrate, the gate dielectric having a gate dielectric breakdown voltage. The predetermined breakdown voltage of the insulation layer may be determined during construction to be greater or less than the gate dielectric breakdown voltage.

If desired, a conductive pad may be connected to the conductor to provide a location for application of the predetermined breakdown voltage.

According to yet another broad aspect of the invention, an apparatus is presented for providing a selectable permanent electrical contact to a structure in a semiconductor substrate. The apparatus includes a conducting layer over the substrate and a first insulation layer insulating the conducting layer from the substrate and the structure. The first insulation layer has a window between the conducting layer and the structure, and a second insulation layer is formed within the window. The second insulation layer has a predetermined breakdown voltage. The first and second insulation layers maybe, for example, an oxide of the substrate, such as $SiO_2$. A voltage source provides a voltage larger than the predetermined breakdown voltage, and contacts are provided to selectively apply the voltage across the second insulation layer. When the voltage is applied across the second insulation layer the second insulation layer breaks down to short the conducting layer to the structure.

According to another broad aspect of the invention, a method is presented for trimming or adjusting an electrical value of a structure of an integrated circuit. The structure may be, for example, an integrated circuit resistor, which has been implanted and diffused into a semiconductor substrate in which the integrated circuit has been constructed. The method includes providing a conductor, for example of metal or doped polysilicon, in contact at one location with a first part of the structure and insulated at another location from a second part of the structure by an insulating layer having a predetermined breakdown voltage. When a voltage in excess of the predetermined breakdown voltage is applied between the conductor and the structure, the insulation breaks down, shorting the conductor to the second part of the structure, thereby removing the portion of the structure between its first and second parts from the integrated circuit.

The conductor and its insulating layer may be constructed as a part of a MOS or CMOS process. The insulating layer may be a single layer of oxide, or a multiple layered dielectric of similar construction to a gate dielectric of a MOS device also constructed on the substrate. Thus, when the insulating layer is constructed, it may be fabricated with a different breakdown voltage that of the gate dielectric of the accompanying MOS device. When the step of applying a voltage in excess of the predetermined breakdown voltage between the conductor and the structure is performed, a voltage may be applied that is less than the breakdown voltage of the gate oxide.

BRIEF DESCRIPTION OF THE DRAWINGS

The invention is illustrated in the accompanying drawings, in which:

FIG. 1 is a top elevational view of a portion of an integrated circuit layout, at an intermediate stage of fabrication, at which a trimmable resistor and accompanying MOS transistor have been constructed FIG. 2 is a cross-sectional view of the structure of FIG. 1, taken at 2—2.

FIG. 3 is a cross-sectional view of the structure of FIG. 1, taken at 3—3.

In the various figures of the drawings, like reference numerals are used to denote like or similar parts.

DETAILED DESCRIPTION OF THE PREFERRED EMBODIMENTS

Figure 4:
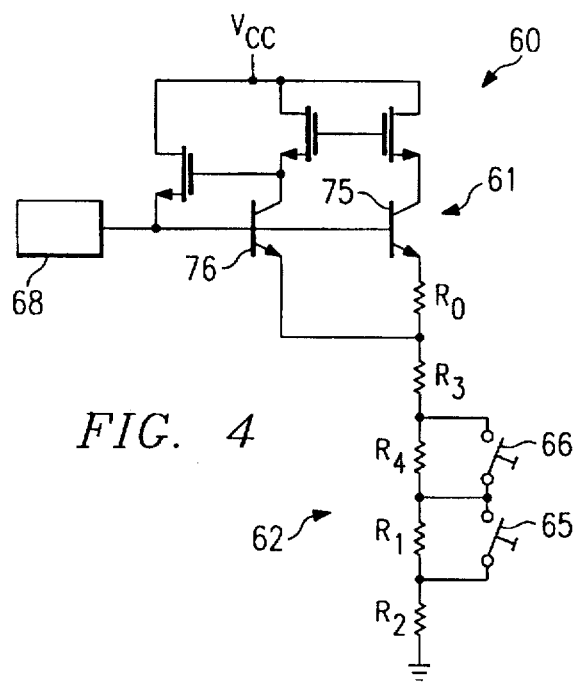
FIG. 4 is an electrical schematic diagram of a bandgap regulator voltage regulator circuit incorporating a trimmable resistor, in accordance with a preferred embodiment of the invention.

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Reference is first made to FIGS. 1, 2, and 3 in which a top elevational view and a side cross sectional views are respectively shown of a portion 10 of an integrated circuit at an intermediate stage of fabrication. It should be understood that the structural representations in FIG. 1 are layout or positional representations only, as impurity diffusions and implants would not be visible in an actual structure, and the various vertical levels may be partially or wholly concealed by various intermediate levels.

The portion 10 includes a trimmable resistor 12 and accompanying MOS transistor 13, which may be a part of the same circuit, or may be a part of a separate circuit that may be formed on the common semiconductor substrate 15. The substrate 15 in the embodiment shown is of P conductivity type, and may be, for example, a P type epitaxial layer constructed as a part of a typical CMOS process; however, it should be noted that the invention can be practiced with structures of different conductivity types.

The MOS transistor 13 is of conventional construction, and includes source and drain regions 16 and 17, and gate conductor 20 overlying the channel region 21. A gate dielectric 24, best seen in FIG. 2, of thickness $t_1$, is formed between the gate 20 and channel 21, in conventional manner. The gate dielectric 24 may be an oxide layer, or a multilayer structure, hand has a known breakdown voltage, depending upon a number of factors, including its thickness $t_1$.

The trimmable resistor 13 is a structure formed in the embodiment illustrated by an N− type impurity implant region 24 in the P type substrate 15. At various locations along the length of the implant region 24 are high conductivity regions 26, formed by N+ type implants. The N+ regions 26 serve to enable contact to be made to the various portions of the resistor implant region 24.

As best seen in FIGS. 2 and 3, a layer of oxide 30 is formed over the substrate 15 and resistor implant region 24 over which subsequent structures can be formed. More particularly, diffusion contacts 32 and 33 are formed over the oxide layer 30. The contacts 32 and 33 may be of metal, doped polysilicon, or other suitable conductor material. Contact 32, best seen in FIGS. 1 and 3 is formed to contact the N+ region 26 through a window 36 in the oxide 30 in contact region 38. A pad 39 is provided as a part of the contact 32 by which electrical connections may be established to the resistor implant region 24, as below described.

The contact 33 has a bifurcated portion with two arms 41 and 42 spanning a region 45 of the resistor implant region 24. A pad area 52 is provided, electrically connected to the arms 41 and 42, by which electrical contact can be made to the top end of the resistor implant region 24, and by which a trim voltage may be applied.

The arm 41 is electrically connected to a first part of the resistor implant region 24 in contact region 46, in a manner similar to the above described connection of the contact 32. On the other hand, the arm 42 extends over the resistor implant region 24, but is insulated from the resistor implant region 24 by a layer of oxide 48, best seen in FIG. 2. The oxide 48 overlies an N+ type impurity contact region 50 to which electrical contact may be selectively accomplished, as below described. The oxide 48 is of thickness $t_2$, and may be fabricated, for instance, by etching a window in the oxide layer 30 and regrowing an oxide layer to the desired thickness $t_2$, to establish a desired predetermined breakdown voltage in the contact region 50. The thickness, $t_2$, may be, for example, on the order of about 200 Å. Preferably, the breakdown voltage of the oxide 48 will be smaller than the breakdown voltage of the gate dielectric 20 of the MOS transistor 13; however, depending upon the application or the design of the accompanying circuitry and the relationships between the MOS transistors with the structures to be trimmed, the breakdown voltage of the oxide 48 may be the same as or larger than the breakdown voltage of the gate dielectric 20 of the MOS transistor 13.

According to the invention, to trim the value of the resistor provided by the resistor implant region 24, a voltage, $V_{TRIM}$, 55 may be applied between the pads 52 and 39 of the conductors 33 and 32, respectively. If the voltage, $V_{TRIM}$, 55 is greater than the predetermined breakdown voltage, $BV_{OXIDE}$, the oxide in the region 50 will permanently break down, shorting the arm 42 of the contact 33 to the underlying resistor implant region 24. It should be noted that unlike zener zapping techniques of the prior art, if an unsuccessful attempt is made to break down the oxide 48 to short the contact 33 to the resistor implant region 24, no adverse effects are produced, and subsequent attempts may be made with a reasonable expectation of success. The result of the successful breakdown of the oxide 48 within the region 50 is that the bifurcated arms 41 and 42 of the contact 33 effectively short the region 45 of the resistor implant region 24, thereby reducing the value of resistance presented by the resistor implant region 24 by the resistance amount contributed by the region 45.

It will be appreciated that although the trimming technique of the invention has been described with reference to trimming an implanted resistor structure, it can be equally advantageously employed in conjunction with other integrated circuit structures as well. For example, it can be used to trim other structures across which it can be connected, or even to deselect active components.

Figure 5:
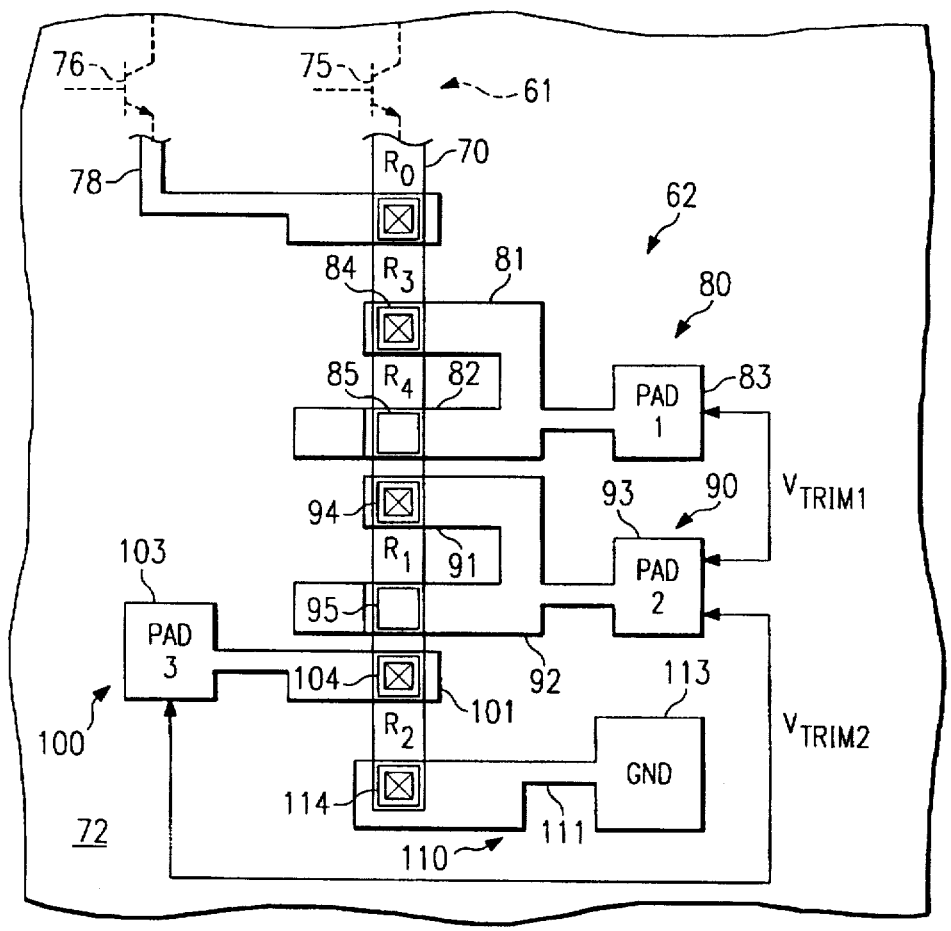
FIG. 5 is a top elevational view of a portion of an integrated circuit layout, showing one technique for constructing the trimmable resistor used in the bandgap voltage regulator of FIG. 4.

Another example of component trimming is shown in FIGS. 4 and 5, which show a typical bandgap voltage regulator circuit 60, an electrical schematic of which being shown in FIG. 3, and an integrated circuit layout of the resistor of which being shown in FIG. 4. The voltage regulator circuit 60 has an active component section 61 of known construction, and a resistor section 62. Schematically, the resistor section 62 includes a number of resistors $R_0$–$R_4$ connected in a series string, with "antifuse" structures 65 and 66 being connected in parallel with resistors $R_1$ and $R_4$. Although only two "antifuse" structures are shown, any number of such resistor antifuse structure combinations can be employed to increase the range of values that can be reached by trimming the resistors in the string. In practice, after construction of the voltage regulator circuit 60, the voltage at the output terminal 68 is measured. The measurement may vary slightly from one circuit to another, due primarily to process variations and feature size variations which may exist in the particular BiCMOS process by which the voltage regulator circuit 60 is constructed. Then one or more of the antifuse structures 65 and 66, are blown, as needed, shorting $R_1$ or $R_4$ from the series string 62, thereby removing a known amount of resistance from the series string. The particular values of the resistances in the string 62 are a matter of design choice; however, the values should be predetermined to a sufficient extent that the values selected, or selectively removed from string, can be calculated with a suitable degree of accuracy.

According to an embodiment of the invention, the series string of resistors is provided by an implanted region 70 in a semiconductor substrate 72, shown in FIG. 5. The implanted region 70 is divided into a number of regions of calculated length to have respective values $R_0$–$R_4$. One of the active devices 75 is connected to the top of the resistor string, for example by an implanted conductor (not shown), and another of the active devices 76 is connected by a conductor 78 to the end of the top resistor $R_0$.

The conductor 78 may be constructed of metal, doped polysilicon, or other suitable conducting material overlying an insulating layer (not shown), with feed through contacts at its ends to contact the calculated portion of the implanted region 70 of the resistor string at one end and the desired part of the active device 76 at the other end. The feed through contacts can be constructed in a manner similar to that described above with respect to the embodiments of FIGS. 1–3. Thus, the first resistor $R_0$ is connected between the active devices 75 and 76.

A second conductor 80 having bifurcated arms 81 and 82 spans another portion of the implanted region 70, thereby defining resistors $R_3$ and $R_4$. The conductor 80 includes a pad portion 83 by which contact can be made for application of a trim voltage, as below described. The arm 81 is electrically connected to the implanted region 70 through window 84. On the other hand, the arm 82 is insulated from the implanted region 70 by an insulation layer with separating the arm 82 from the substrate within the window 85 in the oxide on which the arm 82 is constructed. The insulation within the window 85 may be of thickness such that a predetermined voltage will cause it to break down to short the conductor 85 to the underlying substrate 72, and may be, for instance, an oxide of the substrate, such as $SiO_2$ of thickness of about 200 Å.

A third conductor 90 having bifurcated arms 91 and 92 spans still another portion of the implanted region 70 to define a resistor $R_1$. The conductor 90 includes a pad portion 93 by which contact can be made for application of a trim voltage, as below described. The top arm 91 is electrically connected to the implanted region 70 through window 94, located adjacent the arm 82 of the second conductor 80. On the other hand, the arm 92 is insulated from the implanted region 70 by an insulation layer separating the arm 92 from the substrate within the window 95 in the oxide on which the arm 92 is constructed. The insulation within the window 95 may be of thickness such that a predetermined voltage will cause it also to break down to short the conductor 95 to the underlying substrate 72, and may be, for instance, an oxide of the substrate, such as $SiO_2$ of thickness of about 200 Å.

A fourth conductor 100 having a single arm 101 is electrically connected to the implanted region 70 through window 104, located adjacent the arm 92 of the third conductor 90. The conductor 100 includes a pad portion 103 by which contact can be made for application of a trim voltage, as below described.

A fifth conductor 110 having a single arm 111 is electrically connected to the implanted region 70 through window 114. The connection to the implanted region 70 is located to define a resistor $R_2$ between the arms 111 and 101, and includes a pad portion 113 by which contact can be made for application of a trim voltage, as below described. The pad 113 may be connected to ground, the substrate, or other reference potential as needed in the particular circuit embodiment constructed.

In practice, if the value of the resistance $R_4$ is desired to be trimmed or removed from the total value of the series of resistances presented by the implanted region 70, a trim voltage, $V_{TRIM1}$, is applied between the pads 83 and 93 of the conductors 80 and 90. The value of the voltage, $V_{TRIM1}$, is such as to break down the insulation within the window 85 under the arm 82. (If other devices are contained on the integrated circuit that include, for instance, gate dielectrics having their own particular breakdown voltages, the voltage, $V_{TRIM1}$, should be less than gate dielectric breakdown voltage, but larger than the breakdown voltage of the dielectric within the window 85.)

Similarly, if the value of the resistance $R_2$ is desired to be trimmed or removed from the total value of the series of resistances presented by the implanted region 70, a trim voltage, $V_{TRIM2}$, is applied between the pads 93 and 103 of the conductors 90 and 100. The value of the voltage, $V_{TRIM2}$, likewise is such as to breakdown the insulation within the window 95 under the arm 92.

It should be noted that the physical placement of the windows 85 and 95 immediately adjacent the contacts provided respectively to the arms 91 and 101. Thus, the value of resistance contributed by the implanted region 70 is minimum, and will have little effect upon the magnitude of breakdown voltage required to break down the insulation within the windows 85 and 95.

Figure 6:
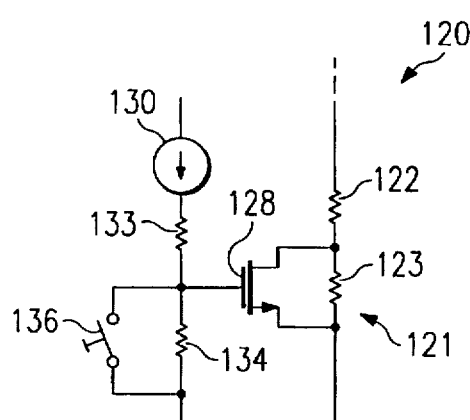
FIG. 6 is an electrical schematic diagram of another circuit, in accordance with a preferred embodiment of the invention, having a trimmable resistor in which an MOS transistor is used to control the inclusion of a portion of the trimmable resistor.

As mentioned, the technique of the invention can be used to select or deselect components of integrated circuits. For example, a schematic diagram of a circuit 120 is shown in FIG. 6 in which a string of series connected resistors 121 is provided. Only two resistors 123 and 124 are shown. A MOS transistor 128 is connected in parallel across the resistor 123, which is trimmable to be included or excluded from the circuit depending upon the conduction state of the MOS transistor 128.

The transistor 128 is biased by a current source 130, which forces a current through resistors 133 and 134. A resistor trimming structure 136 is connected in parallel with the resistor 134. The resistor trimming structure 136 may be constructed, for example, similarly to the structures described above with bifurcated arms spanning the resistor. If the resistor 123 is desired to be removed from the circuit of which it is a part, a trim voltage is applied to the trimming structure 136 to cause it to short the resistor 134. The gate of the MOS transistor 128, therefore, will be held at ground, and the resistor 123 will be shorted. On the other hand, if the resistor 123 is desired to be included in the circuit of which it is a part, the current source 130 causes a voltage drop across the resistor 134, to apply a positive bias to the gate of the MOS transistor 128, holding it out of conduction. The resistor 123 therefore remains in the circuit of which it is a part.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An integrated circuit having an electrically trimable structure, comprising:

a semiconductor substrate;

a structure in said substrate having an electrical value to be trimable;

a MOS transistor connected in parallel with at least a portion of said structure, said MOS transistor having a gate to control a current flow path in said substrate;

a conductor electrically connected to said gate;

an insulation layer separating said conductor from said substrate, said insulation layer having a predetermined breakdown voltage, and wherein when a voltage larger than said predetermined breakdown voltage is applied between said conductor and said substrate, said insulation layer breaks down to short said conductor to said substrate to bias said MOS transistor into conduction, and wherein said gate and said substrate has a gate dielectric between said gate and the substrate, said gate dielectric having a gate dielectric breakdown voltage, and wherein gate dielectric breakdown voltage is less than said predetermined breakdown voltage of said insulation layer.

2. An integrated circuit having an electrically trimmable structure, comprising:

a semiconductor substrate;

a structure in said substrate having an electrical value to be trimmable;

a MOS transistor connected in parallel with at least a portion of said structure, said MOS transistor having a gate to control a current flow path in said substrate;

a conductor electrically connected to said gate;

an insulation layer separating said conductor from said substrate, said insulation layer having a predetermined breakdown voltage, and wherein when a voltage larger than said predetermined breakdown voltage is applied between said conductor and said substrate, said insulation layer breaks down to short said conductor to said substrate to bias said MOS transistor into conduction, and wherein said gate and said substate has a gate dielectric between said gate on the substrate, said gate dielectric having a gate dielectric breakdown voltage, and wherein gate dielectric breakdown voltage is greater than said predetermined breakdown voltage of said insulation layer.

3. The integrated circuit of claim 2, further comprising a conductive pad connected to said conductor to provide a location for application of said predetermined breakdown voltage.

4. The integrated circuit of claim 1, wherein said structure is a resistor and said MOS transistor is connected in parallel with a portion of said resistor.

5. The integrated circuit of claim 1, wherein said conductor is metal.

6. The integrated circuit of claim 1, wherein said conductor is polysilicon.

7. A method for electrically trimming an electrical value of a structure of an integrated circuit, comprising:

forming a semiconductor substrate;

forming a structure in said substrate having an electrical value to be trimmable;

forming a MOS transistor connected in parallel with at least a portion of said structure, said MOS transistor having a gate to control a current flow path in said substrate;

forming a conductor electrically connected to said gate;

forming an insulation layer separating said conductor from said substrate, said insulation layer having a predetermined breakdown voltage, and wherein when a voltage larger than said predetermined breakdown voltage is applied between said conductor and said substrate, said insulation layer breaks down to short said conductor to said substrate to bias said MOS transistor into conduction, and wherein said gate and said substrate has agate dielectric between said gate and the substrate, said gate dielectric having a gate dielectric breakdown voltage, and wherein gate dielectric breakdown voltage is greater than said predetermined breakdown voltage of said insulation layer.

8. The method of claim 7 wherein said step of forming a conductor in contact at one location with a first part of the structure comprises providing a metal layer in contact at one location with a first part of a resistor in a semiconductor substrate.

9. The method of claim 7 wherein said step of forming a conductor in contact at one location with a first part of the structure comprises having a polysilicon layer in contact at one location with a first part of a resistor in a semiconductor substrate.

* * * * *